United States Patent [19]

Hines

[11] Patent Number: 4,596,961
[45] Date of Patent: Jun. 24, 1986

[54] AMPLIFIER FOR MODIFYING A SIGNAL AS A FUNCTION OF TEMPERATURE

[75] Inventor: John R. Hines, Garland, Tex.
[73] Assignee: Motorola, Inc., Schaumburg, Ill.
[21] Appl. No.: 656,206
[22] Filed: Oct. 1, 1984
[51] Int. Cl.[4] .............................................. H03F 3/45
[52] U.S. Cl. .................................... 330/289; 330/256
[58] Field of Search ................ 307/310; 323/313, 314, 323/315, 316; 328/162; 330/149, 256, 288, 289

[56] References Cited

U.S. PATENT DOCUMENTS 4,443,753  4/1984  McGlinchey ...................... 323/313

OTHER PUBLICATIONS

Gilbert, Barrie, "Translinear Circuits", May 1981.

Primary Examiner—Eugene R. LaRoche
Assistant Examiner—Steven J. Mottola
Attorney, Agent, or Firm—Lowell W. Gresham

[57] ABSTRACT

A temperature dependent amplifier which may be used as a system building block in temperature compensation applications is disclosed. A temperature dependent signal source generates a first order temperature dependent signal which is multiplied by an input signal and divided by a temperature reference signal to produce an output which varies in direct proportion with temperature changes. The input signal is multiplied by the temperature reference signal and divided by the temperature dependent signal to produce an output which varies inversely proportional to temperature changes.

19 Claims, 2 Drawing Figures

AMPLIFIER FOR MODIFYING A SIGNAL AS A FUNCTION OF TEMPERATURE

BACKGROUND OF THE INVENTION

This invention relates generally to temperature sensitive electrical circuits. Specifically, the present invention relates to a circuit which provides an output signal that reflects both an input signal and temperature. More specifically, the present invention provides a flexible system building block which may be inserted in a signal path when overall system performance can improve through temperature compensation of particular signals.

The performance of many circuits tends to change when the circuit's temperature changes. Automatic gain circuits and crystal controlled oscillators are two examples. This change in performance is often detrimental to overall system performance. Thus, a system design may include additional circuitry to compensate for the detrimental effects of temperature changes.

Although those skilled in the art use various temperature compensation schemes, such prior art schemes tend to use individual compensation circuits for each temperature compensation need. Conversely, the present invention provides a single temperature compensation building block which can be used in a variety of different ways to achieve many different compensation tasks.

A typical system design approach which incorporates temperature compensation would be to select and interconnect components that produce a desired result at room temperature, then repetatively review and modify the design to insure proper performance over a desired temperature range. Temperature compensation aspects of a design would not be considered until after the basic room temperature design has been completed. Accordingly, a temperature compensation building block that has no effect at room temperature yet provides compensation for more extreme temperatures would greatly aid system design efforts.

Temperature sensors may represent a prior art temperature compensation building block. One type of sensor known in the art utilizes the difference in voltage between the base and emitter junctions of transistors operating at different current densities to indicate temperature. However, such sensors merely provide an output voltage which varies as a function of absolute temperature and do not achieve temperature compensation without additional circuitry to combine the temperature signal with a signal that is to be temperature compensated. Additionally, such sensors require control over the resistance of on-chip resistors and over the area of transistor emitter junctions in order to control the responsiveness of the sensor to temperature. Furthermore, individual temperature compensation schemes which use such sensors must make allowances for the temperature characteristics of the additional components used in the combining circuitry.

The prior art temperature compensation building blocks, such as the sensor mentioned above, do not conveniently fit into the typical design process because they require a complicated and costly design effort for each individual temperature compensation task. For example, if an input signal needs temperature compensation a designer must discover how to combine a temperature sensitive signal from a temperature sensor with the input signal. The designer must further determine how to control the absolute temperature indicated by the sensor so that the temperature signal affects the input signal only to the amount that the temperature differs from room temperature. Furthermore, a temperature analysis must include the temperature characteristics of the components used in achieving the combining and controlling functions.

Accordingly, it is an object of the present invention to fill a need for reducing the complication and cost inherent in a temperature compensation design effort by providing a system building block that permits simple and easy to design temperature compensation.

Another object concerns flexibility so that the present invention can be useful for a wide variety of applications.

Still another object concerns providing a circuit that may be incorporated within integrated circuits, may be an integrated circuit by itself, or may be constructed using discrete components.

SUMMARY OF THE INVENTION

The above and other objects and advantages of the present invention are carried out in one form by a temperature dependent amplifier which includes a multiplier, a divider, a temperature reference source, and a first order temperature dependent signal source. The temperature reference source generates a signal substantially equivalent to a signal generated by the temperature dependent signal source when the temperature dependent signal source is at a predetermined temperature. The multiplier and divider cooperate so that an input signal is multiplied by either a signal from the temperature reference source or a signal from the temperature dependent signal source, and divided by either the signal from the temperature dependent signal source or the signal from the temperature reference source, respectively.

BRIEF DESCRIPTION OF THE DRAWINGS

A more complete understanding of the invention and a fuller appreciation of the many advantages thereof will be readily derived by reference to the detailed description and claims when considered in connection with the accompanying drawings, wherein:

DETAILED DESCRIPTION OF THE INVENTION

Figure 1:
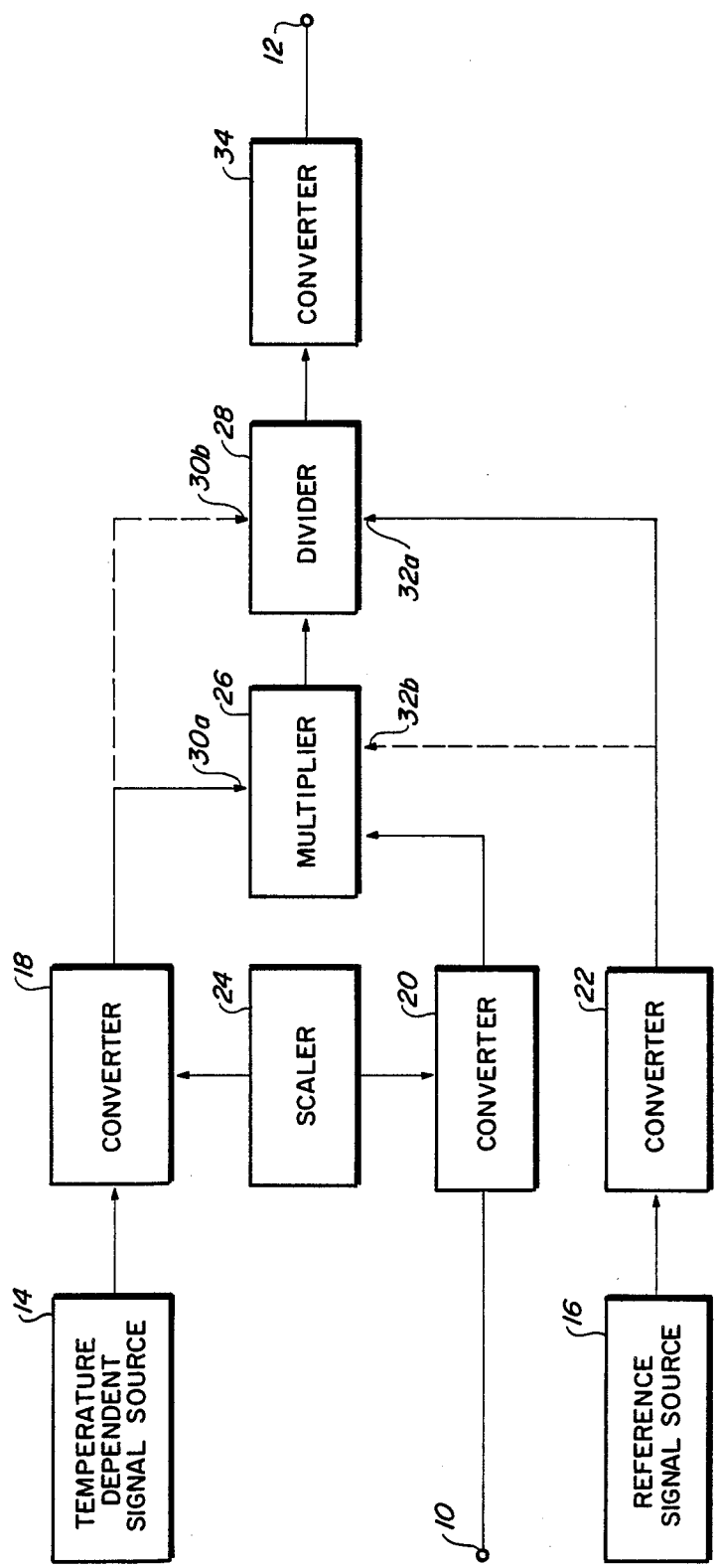
FIG. 1 shows a block diagram of the present invention.

FIG. 1 shows a block diagram of one embodiment of the present invention wherein a terminal 10 receives an amplifier input signal to be temperature compensated, and a terminal 12 provides a temperature compensated amplifier output signal. A temperature dependent signal source 14 connects to an input of a first converter 18, terminal 10 connects to an input of a second converter 20, and a reference signal source 16 connects to an input of a third converter 22. A scaler 24 connects to both first converter 18 and second converter 20. An output of second converter 20 connects to a first input of a multiplier 26, and an output of multiplier 26 connects to a first input of divider 28. An output of divider 28 connects to an input of a fourth converter 34, and an output of converter 34 connects to terminal 12.

Outputs from first converter 18 and third converter 22 may be selectively connected to either multiplier 26 or divider 28 depending on whether the amplifier output signal varies in direct proportion or inversely proportional to temperature changes. If first converter 18 connects to a second input of multiplier 26 through a connection 30a, then third converter 22 connects to a second input of divider 28 through a connection 32a. The 30a and 32b connections are used in a first embodiment of the present invention and cause the amplifier output signal to vary in direct proportion with temperature changes. Likewise, if first converter 18 connects to the second input of divider 28 through a connection 30b, then third converter 22 connects to the second input of multiplier 26 at a connection 32b. The 30b and 32b, connections are used in a second embodiment of the present invention and cause the amplifier output signal to vary inversely proportional to temperature changes. Connections 30a and 32a, which are used in the first embodiment, are shown as solid lines in FIG. 1 while connections 30b and 32b, which are used in the second embodiment, are shown in phantom.

Temperature dependent signal source 14 represents a temperature sensor that generates a signal directly proportional to temperature. The output signal is linearly related to the temperature over the temperature range of the device. Hence, signal source 14 also represents a first order signal source because the signal varies as a function of temperature raised to the first power. Further, the output from signal source 14 may be related to absolute temperature, which is characterized in degrees-Kelvin.

One technique for constructing signal source 14 involves utilizing a circuit which measures the difference between base-emitter voltages on two transistors at substantially the same temperature but operating at different current densities. Those skilled in the art realize that several different implementations of a first order temperature dependent signal source are possible. One such circuit is described hereinbelow in connection with FIG. 2. An example of another such circuit may be found in FIG. 3 of U.S. Pat. No. 4,443,753, entitled SECOND ORDER TEMPERATURE COMPENSATED BANDGAP VOLTAGE REFERENCE, by Gerard F. McGlinchey and issued Apr. 17, 1984.

Reference signal source 16 generates a substantially temperature independent DC signal. In other words, the reference source generates a temperature reference signal which changes only an insignificant amount over time and temperature. Those skilled in the art realize that such a reference signal source may be obtained using many different techniques, such as commonly available voltage and current regulation circuits. In some applications mere power supply voltage may suffice.

Converters 18, 20, and 22 interface a temperature dependent signal from temperature dependent signal source 14, the input signal at terminal 10, and a reference signal from reference signal source 16, respectively, to multiplier 26 and divider 28 so that these signals are compatible with the needs of multiplier 26 and divider 28. Likewise, converter 34 interfaces the output from divider 28 to terminal 12 so that the temperature compensated output signal is compatible with system needs.

Many factors dictate the nature of converters 18, 20, 22, and 34. The requirements of multiplier 26 and divider 28 represent one such factor. The form of the input signals to multiplier 26 and divider 28 represents another factor. For example, multiplier 26 and divider 28 may perform their respective functions digitally. Thus, converters 18, 20, and 22 may represent analog-to-digital converters, while converter 34 might represent a digital-to-analog converter. Alternatively, multiplier 26 and divider 28 may multiply and divide voltage signals, so that converters 18, 20, 22, or 34 might be required to convert a current or frequency signal into a voltage signal. In an example described below in connection with FIG. 2, multiplier 26 and divider 28 operate on currents. Thus, electrical currents represent the information to be multiplied and divided by multiplier 26 and divider 28; and, converters 20, 22, and 34 convert voltages into currents.

One member of a pair of converters consisting of converter 18 and converter 22 performs an additional function in the present invention. The signal output from temperature dependent signal source 14 reflects only the temperature. At a predetermined temperature, such as room temperature for example, the signal output from source 14 demonstrates a characteristic value which is substantially free from the influences of time and other signals. The present invention divides either the temperature dependent signal or the reference signal by the other of the two. The output from converter 18 equals the output from converter 22 at this predetermined temperature. Thus, the amplifier output signal of the present invention reflects no temperature influence at this predetermined temperature because temperature effects cancel through the division process. Accordingly, either converter 18 or converter 22 appropriately scales the signal it converts so that the signals output from converters 18 and 22 are equivalent at the predetermined temperature.

Scaler 24 attenuates the amplitude of the temperature dependent signal and the input signal so that the authority the temperature signal exerts on the input signal may be controlled. The scaler allows a designer to modify the transfer function of the present invention so that the flexibility objective may be achieved. Although the FIG. 1 embodiment shows scaler 24 connected to converters 18 and 20, those skilled in the art will recognize that the scaling function could be applied to any combination of converters 18, 20, 22 and 34 rather than the connection shown in FIG. 1. For example, the embodiment shown in FIG. 2 accomplishes the scaling function through connections to converters 20 and 34.

Those skilled in the art know of several schemes for implementing multiplier 26 and divider 28. For example, computers, analog-to-digital converters, operational amplifier circuits, and dedicated integrated circuits may be used in performing multiplication and division. Furthermore, since multiplication and division are arithmetically communicative properties, the order of the operations is immaterial. Although the FIG. 1 embodiment shows multiplier 26 preceding divider 28 in the signal flow path, the order of these two sections may be reversed or combined in a single operation.

As mentioned above, if the second inputs of multiplier 26 and divider 28 are connected using connections 30a and 32a, then the amplifier output signal varies in direct proportion to temperature. However, if connections 30b and 32b are used, then the amplifier output signal varies inversely proportional to temperature. Using connections 30b and 32a, the overall transfer function for the present invention may be derived as follows:

$$S1 = K1 \cdot T$$

where
S1 = a signal output from first converter 18;
K1 = a scaling constant applied by converter 18; and
T = absolute temperature in degrees-Kelvin.

$$S2 = K2 \cdot In$$

where
S2 = the signal output from second converter 20;
K2 = a scaling constant applied by converter 20; and
In = the amplifier input signal at terminal 10.
And, $$S3 = K1 \cdot To$$

where
S3 = a signal output from third converter 22; and
To = a predetermined temperature, typically room temperature.
Thus, $$\begin{aligned} Out &= K4 \cdot S1 \cdot S2/S3 \\ &= K4 \cdot K1 \cdot T \cdot K2 \cdot In/(K1 \cdot To), \\ &= In \cdot Kt \cdot T/To; \end{aligned}$$

where
Out = the amplifier output signal at terminal 12; and
Kt = a combination of scale factors equivalent to $$K2 \cdot K4$$

The transfer function of the embodiment shown in FIG. 1 using connections 30b and 32b can be shown as:

$$Out = In \cdot Kt \cdot To/T.$$

Figure 2:
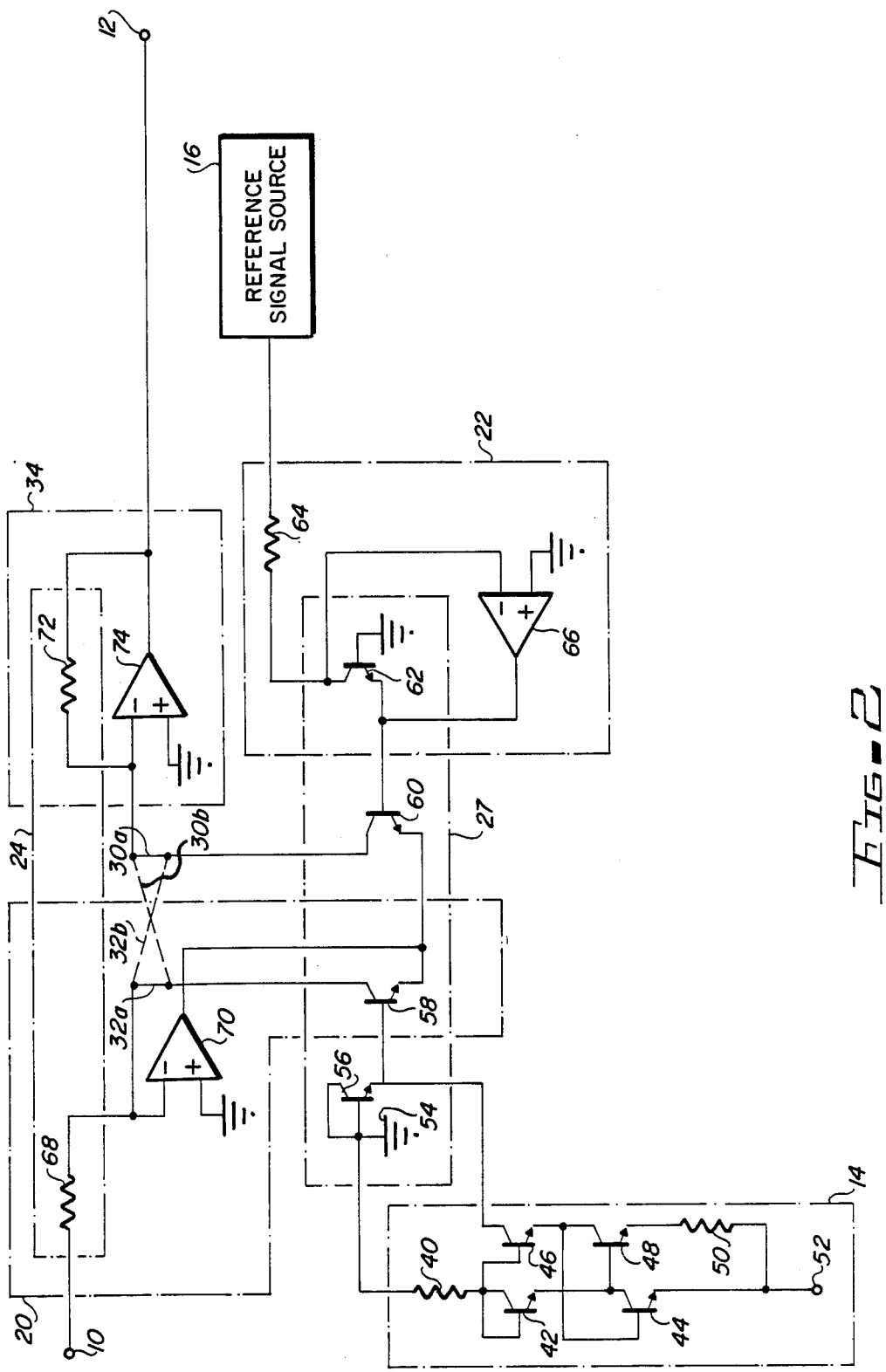
FIG. 2 shows a detailed circuit schematic of one embodiment of the present invention.

FIG. 2 shows a detailed circuit schematic of an embodiment of the present invention. Since the FIG. 2 embodiment is similar to the FIG. 1 embodiment, blocks in FIG. 2 which have equivalent reference numbers to blocks in FIG. 1 indicate functions which correspond to those described above in connection with FIG. 1.

In the FIG. 2 embodiment temperature dependent signal source 14 includes a biasing resistor 40 connected between a terminal 54 adapted to receive a common potential or ground, and a collector and a base of an NPN transistor 42. A base of an NPN transistor 46 also connects to the collector and base of transistor 42. An emitter of transistor 46 connects to a collector of an NPN transistor 48 and to a base of an NPN transistor 44. An emitter of transistor 42 connects to a collector of transistor 44 and to a base of transistor 48. An emitter of transistor 48 connects to a first node of a resistor 50. A second node of resistor 50 and an emitter of transistor 44 both connect to a terminal 52 adapted to receive a negative DC voltage. The output of temperature dependent signal source 14 is represented by a current which flows into the collector of transistor 46.

Biasing resistor 40 biases transistor 42. Transistor 42 provides current for transistor 44 and biasing for transistor 46. Although transistor 42 is shown as a transistor, those skilled in the art will recognize that a diode could be used to accomplish the same function.

In this embodiment transistor 48 has a larger emitter area than that of transistor 44. Thus, transistor 48 operates at a different current density than transistor 44. If the present invention is implemented within an integrated circuit, methods of achieving the large emitter area are known in the art. If the present invention is implemented using discrete components, a plurality of matched transistors may be connected in parallel to achieve the large emitter area. A difference between the base-emitter voltage of transistor 44 and of transistor 48 develops due to the absolute temperature of the circuit, as follows:

$$VR50 = k \cdot T \cdot \ln(x)/q$$

where
VR50 = the voltage across resistor 50;
k = Boltzmann's constant;
T = the absolute temperature in degrees-Kelvin;
q = the charge on an electron; and
x = the ratio of the emitter of transistor 48 to the emitter of transistor 44.

Resistor 50 translates the voltage difference into a current. Those skilled in the art recognize that base currents can be ignored in the analysis of transistor circuits when the gain of the transistors is large. A large gain is a common characteristic of discrete and integrated circuit, signal, NPN transistors such as those described herein. Thus, the current through resistor 50 is essentially the same current that transistor 46 sinks as the output from temperature dependent signal source 14. Accordingly, a transfer function for the current generated by source 14 is defined wherein:

$$Itds = k \cdot T \cdot \ln(x)/(q \cdot R50) \qquad (1)$$

where
Itds = the current output from source 14; and
R50 = the resistance of resistor 50.

A multiplier cell 27 in FIG. 2 represents the equivalent of a combination of multiplier 26 and divider 28 from FIG. 1. Multiplier cell 27 contains an NPN transistor 56 having a base and a collector which are both connected to ground 54. An emitter of transistor 56 connects to a base of an NPN transistor 58; an emitter of transistor 58 connects to an emitter of an NPN transistor 60; a base of transistor 60 connects to an emitter of an NPN transistor 62; and a base of transistor 62 connects to ground 54.

The base-to-emitter connections of the transistors in multiplier cell 27 form a loop so that the sum of the base-emitter voltages of transistors 56 and 58 equal the sum of the base-emitter voltages of transistors 60 and 62. Thus:

$$Vbe56 + Vbe58 = Vbe60 + Vbe62$$

where
Vbe56 = the base-emitter voltage of transistor 56;
Vbe58 = the base-emitter voltage of transistor 58;
Vbe60 = the base-emitter voltage of transistor 60; and
Vbe62 = the base-emitter voltage of transistor 62.

From an equation known in the art as Ebers-Moll equation, the base-emitter voltage of a transistor is related to the collector current as follows:

$$Vbe = (k \cdot T/q) \cdot (\ln(Ic/Is))$$

where
K, T, and q = Boltzmann's constant, temperature, and electron charge as described above;
Ic = the current flowing in the collector;

Is = a constant related to emitter junction reverse saturation current; and

Vbe is much larger than (KT/q), which approximates 26 mv at room temperature.

By substitution and noting that (Is) is substantially equivalent for each of the 4 transistors when matched transistors are used, the result becomes:

$$Ic56 \cdot Ic58 = Ic60 \cdot Ic62; \text{ or}$$

$$Ic60 = Ic56 \cdot Ic58/Ic62; \text{ or} \quad (2)$$

$$Ic58 = Ic60 \cdot Ic62/Ic56 \quad (3)$$

where
- Ic56 = the collector current through transistor 56;
- Ic58 = the collector current through transistor 58;
- Ic60 = the collector current through transistor 60; and
- Ic62 = the collector current through transistor 62.

Thus, equations 2 and 3 define an output that represents a multiplication of two signals divided by a third signal as required in the present invention. Electrical currents represent all inputs to multiplier cell 27 in equations 2 and 3. Equation 2 represents the transfer function exhibited by multiplier cell 27 when connections 30a and 32a are used and the amplifier output varies in direct proportion to temperature. Ic56 and Ic58 represent multiplicand inputs because they are multiplied together. Ic62 represents a reciprocal input because Ic56 and Ic58 are divided by Ic62, or in other words multiplied by the reciprocal of Ic62. On the other hand, equation 3 represents the transfer function exhibited by multiplier cell 27 when connections 30b and 32b are used and the amplifier output varies inversely proportional to temperature. Ic60 and Ic62 represent multiplicand inputs because they are multiplied together. Ic56 represents a reciprocal input because Ic60 and Ic62 are divided by Ic56, or in other words multiplied by the reciprocal of Ic56.

Since the output from temperature dependent signal source 14 in FIG. 2 is a current, no converter is needed between it and multiplier cell 27 in this embodiment. Thus the collector of transistor 46 connects to the emitter of transistor 56. As discussed above, base currents in signal NPN transistors are commonly ignored in circuit analysis. Accordingly, the emitter current of transistor 56 is substantially equivalent to the collector current of transistor 56, and provides the temperature dependent signal in this embodiment.

In this embodiment reference signal source 16 exhibits a predetermined voltage. Converter 22 converts the generated reference voltage into a reference current and applies the reference current to a collector of transistor 62 in multiplier cell 27. Thus, converter 22 represents a voltage-to-current converter. In this embodiment transistor 62 forms an integral portion of both multiplier cell 27 and converter 22. Accordingly, a resistor 64 connects between reference signal source 16 and the collector of transistor 62. An operational amplifier (op amp) 66 has an output connected to the emitter of transistor 62, a negative input connected to the collector of transistor 62, and a positive input connected to ground 54.

Transistor 62 provides a negative feedback path for op amp 66, and the positive input of op amp 66 is connected to a common potential. Hence, op amp 66 tends to sink that amount of current which forces the voltage at its negative input to equal the voltage of its positive input, or ground. This causes the current flowing through resistor 64 to equal the voltage demonstrated by reference signal source 16 divided by the resistance of resistor 64. The analysis may ignore the input current of an op amp and the base current of an NPN signal transistor. Thus, the transfer junction for the current into the collector of transistor 62 (Ic62) is represented by the voltage demonstrated by reference signal source 16 divided by the resistance of resistor 64.

As mentioned above converter 22 and converter 18 generate equivalent signals at a predetermined temperature. The FIG. 2 embodiment of a the present invention omits converter 18. Thus, the predetermined voltage exhibited by reference signal source 16 and the current output from converter 22 are manipulated to generate a current value which corresponds to a characteristic value generated by temperature dependent signal source 14 at the predetermined temperature (To). Room temperature, or 300 degrees-Kelvin, represents this predetermined temperature in the present embodiment. Accordingly, resistor 64 is chosen so that the temperature reference signal, or the current flowing in transistor 62 (Ic62), equals the current output from temperature dependent signal source 14 at 300 degrees-Kelvin, or:

$$R64 = Vref \cdot q \cdot R50/(k \cdot To \cdot \ln(x)) \text{ and}$$

$$Ic62 = Vref/R64$$

where
- R64 = the resistance of resistor 64;
- Vref = the voltage output from reference source 16;
- q = the charge of an electron;
- R50 = the resistance of resistor 50;
- K = Boltzmann's constant;
- To = room temperature, or degrees-Kelvin;
- x = the emitter ratio of transistors 48 and 44; and
- Ic62 = the collector current through transistor 62.

In this FIG. 2 embodiment the amplifier input signal at terminal 10 represents a voltage signal. Thus, converter 20 converts the input voltage into a current and applies this current to the collector of either transistor 58 or transistor 60. If connections 30a and 32a are used, then a first node of a resistor 68 connects to terminal 10 and a second node of resistor 68 connects to a collector of transistor 58. If connections 30b and 32b are used, then the second node of resistor 68 connects to a collector of transistor 60. Regardless of whether connections 30a and 32a or 30b and 32b are used, a negative input of an op amp 70 connects to the second node of resistor 68, a positive input of op amp 70 connects to ground 54, and an output of op amp 70 connects to the emitter of transistors 58 and 60.

Converter 20 operates in a manner similar to that described above for converter 22. If connections 30a and 32a are used, then transistor 58 forms an integral portion of both converter 20 and multiplier cell 27. However, if connections 30b and 32b are used, then it is transistor 60 that forms the integral portion of both converter 20 and multiplier cell 27. Accordingly, a transfer function for converter 20 is defined so that the input current to multiplier cell 27 equals the input voltage at terminal 10 divided by the resistance of resistor 68.

In this embodiment the amplifier output signal at terminal 12 represents a voltage signal. Thus, converter 34 converts current output from multiplier cell 27 into a voltage. If connections 30a and 32a are used, then the collector of transistor 60 connects to a negative input of an op amp 74. If connections 30b and 32b are used then the collector of transistor 58 connects to the negative input of an op amp 74. Regardless of whether connections 30a and 32a or 30b and 32b are used, a resistor 72 connects between the negative input of op amp 74 and an output of op amp 74, a positive input of op amp 74 connects to ground 54, and the output from op amp 74 connects to terminal 12.

Converter 34 operates as a current-to-voltage converter because the transistor sinks current in generating the output of multiplier cell 27. Op amp 74 outputs a voltage sufficient to produce a current through resistor 72 which equals the current requirements of the transistor. This voltage at the negative input of op amp 74 is held equivalent to the voltage at the positive input of op amp 74, or at a ground potential. Since the negative input of op amp 74 remains at a ground potential, and since the current through resistor 72 is substantially equivalent to the current through the transistor, a transfer function for converter 34 is defined wherein the voltage output is equivalent to the current through the transistor times the resistance of resistor 72.

By combining the transfer functions for converters 20, 22, and 34, with the transfer functions for temperature dependent signal source 14 and multiplier cell 27, the resulting transfer function for the present invention using connections 30a and 32a becomes:

$$Vout = Vin \cdot R72 \cdot T/(R68 \cdot To). \quad (4)$$

The use of connections 30b and 32b produces a transfer function for the present function defined as follows:

$$Vout = Vin \cdot R72 \cdot To/(R68 \cdot T) \quad (5)$$

Equations 4 and 5 show that the scaling accomplished by scaler 24 occurs through resistors 72 and 68. Resistors 72 and 68 may be selected so that they exhibit substantially equivalent temperature coefficients. If resistors 68 and 72 exhibit equivalent temperature coefficients, then temperature effects operating on resistors 68 and 72 tend to cancel.

The present invention may be used as a system building block merely by selection of the ratio of resistors 72 and 68. Higher order temperature functions are also achieved through use of the present invention by cascading a plurality of stages of the present invention together.

As can be seen from equations 4 and 5, many of the parameters which are important in the individual transfer functions for temperature dependent signal source 14 and converters 20, 22, and 34 are not important in the resulting transfer functions. For example, the resistance of resistors 50 and 64, the ratio of emitter areas of transistors 44 and 48, and the voltage exhibited by reference signal source 16 do not affect the resulting transfer functions. Furthermore, the temperature coefficient characteristics of the converters, and multiplier cell 27 are not significant in the present embodiment because such characteristics tend to be self-canceling. This result tends to promote the ease of use of the present invention as a system temperature compensation building block.

However, the present invention may nevertheless benefit from some attention to these parameters. Practical considerations may suggest that the ratio of emitter areas of transistors 44 and 48 be as large as possible.

Additionally, if resistors 50 and 64 may advantageously be chosen and located near each other so that they exhibit substantially equivalent temperature coefficients. Furthermore, the transistors of multiplier cell 27 may advantageously be matched.

The foregoing description uses various embodiments to illustrate the present invention. However, those skilled in the art will recognize that changes and modifications may be made in these embodiments without departing from the scope of the present invention. For example, the above embodiments have described particular polarities for transistors; but, those skilled in the art will recognize that the present invention may be implemented using either NPN or PNP transistors. These and other modifications obvious to those skilled in the art are intended to be included within the scope of this invention.

What is claimed is:

1. A temperature dependent amplifier comprising:
   means, having first and second multiplicand inputs, a reciprocal input, and an output, for multiplying so that a signal at the output represents the product of signals at the first and second multiplicand inputs divided by a signal at the reciprocal input, the first multiplicand input of said multiplying means being adapted to receive an amplifier input signal and the output being adapted to provide an amplifier output signal;
   means, coupled to a first one of the second multiplicand and reciprocal inputs of said multiplying means for generating a first order temperature dependent signal having a characteristic value at a predetermined temperature; and
   means, coupled to a second one of the second multiplicand and reciprocal inputs of said multiplying means, for generating a temperature reference signal having a value equivalent to the characteristic value of said generating means.

2. A temperature dependent amplifier as claimed in claim 1 wherein said temperature dependent signal generating means comprises:
   a first transistor having a collector, a base, and an emitter, said first transistor collector being coupled to said multiplying means;
   a second transistor having a collector, a base, and an emitter, said second transistor collector being coupled to the emitter of said first transistor;
   a third transistor having a collector, a base, and an emitter, said third transistor base coupled to the emitter of said first transistor, and said third transistor collector being coupled to the base of said second transistor;
   a first resistor having first and second nodes, said first resistor first node being coupled to the emitter of said second transistor, and said first resistor second node being coupled to the emitter of said third transistor; and
   means, coupled to said first, second, and third transistors, for supplying current to said third transistor and for biasing the base of said first transistor.

3. A temperature dependent amplifier as claimed in claim 2 wherein said temperature reference signal generating means comprises a voltage reference exhibiting a predetermined voltage, and the temperature dependent amplifier additionally comprising:
   a first operational amplifier; and a second resistor coupled between said voltage reference and said first operational amplifier wherein said second resistor and the predetermined voltage correspond to the characteristic value of said temperature dependent signal generating means.

4. A temperature dependent amplifier as claimed in claim 3 wherein said first and second resistors exhibit substantially equivalent temperature coefficients.

5. A temperature dependent amplifier as claimed in claim 1 additionally comprising means, coupled to said multiplying means, for scaling the amplifier output signal relative to the temperature dependent signal and the amplifier input signal.

6. A temperature dependent amplifier as claimed in claim 5 wherein:
   said multiplying means operates on currents; and
   signals presented to the first, second, and reciprocal inputs and at the output of said multiplying means represent electrical currents.

7. A temperature dependent amplifier as claimed in claim 6 additionally comprising:
   a first voltage-to-current converter having a voltage input and a current output, said first converter output being coupled to the first input of said multiplying means and said first converter input being adapted to receive the amplifier input;
   a second voltage-to-current converter having a voltage input and a current output, said second converter output being coupled to said multiplying means and said second converter input being coupled to said temperature reference signal generating means; and
   a current-to-voltage converter having a current input and a voltage output, the current input being coupled to the output of said multiplying means and the voltage output being adapted to provide the amplifier output signal.

8. A temperature dependent amplifier as claimed in claim 6 wherein said multiplying means comprises:
   a first transistor having a base and an emitter, the first transistor emitter being coupled to said temperature dependent signal generating means;
   a second transistor having a collector, a base, and an emitter, said second transistor base being coupled to the emitter of said first transistor, and said second transistor collector being coupled to said scaling means;
   a third transistor having a collector, a base, and an emitter, said third transistor emitter being coupled to the emitter of said second transistor, and said third transistor collector being adapted to provide the amplifier output signal; and
   a fourth transistor having a collector, a base, and an emitter, said fourth transistor emitter being coupled to the base of said third transistor, said fourth transistor collector being coupled to said temperature reference signal generating means, and said fourth transistor base being coupled to the base of said first transistor.

9. A temperature dependent amplifier as claimed in claim 8 additionally comprising a first operational amplifier having an input and an output, said first amplifier input being coupled to the collector of said second transistor, and said first amplifier output being coupled to the emitter of said second transistor.

10. A temperature dependent amplifier as claimed in claim 9 additionally comprising a second operational amplifier having an input and an output, said second amplifier input being coupled to the collector of said third transistor and to said scaling means, and said second amplifier output being adapted to provide the amplifier output signal.

11. A temperature dependent amplifier as claimed in claim 10 wherein said scaling means comprises:
   a first resistor having first and second nodes, said first resistor first node being coupled to the collector of said second transistor, and said first resistor second node being adapted to receive the amplifier input signal; and
   a second resistor being coupled between the input and the output of said second operational amplifier.

12. A temperature dependent amplifier as claimed in claim 6 wherein said multiplying means comprises:
   a first transistor having a base and an emitter, the emitter being coupled to said temperature dependent signal generating means;
   a second transistor having a collector, a base, and an emitter, said second transistor base being coupled to the emitter of said first transistor, and said second transistor collector being adapted to provide the amplifier output signal;
   a third transistor having a collector, a base, and an emitter, said third transistor emitter being coupled to the emitter of said second transistor, and said second transistor collector being coupled to said scaling means; and
   a fourth transistor having a collector, a base, and an emitter, said fourth transistor emitter being coupled to the base of said third transistor, said fourth transistor collector being coupled to said temperature reference signal generating means, and said fourth transistor base being coupled to the base of said first transistor.

13. A temperature dependent amplifier as claimed in claim 12 additionally comprising a first operational amplifier having an input and an output, said first amplifier input being coupled to the collector of said third transistor, and said first amplifier output being coupled to the emitter of said third transistor.

14. A temperature dependent amplifier as claimed in claim 12 additionally comprising a second operational amplifier having an input and an output, said second amplifier input being coupled to the collector of said second transistor and to said scaling means, and said second amplifier output being adapted to provide the amplifier output signal.

15. A temperature dependent amplifier as claimed in claim 14 wherein said scaling means comprises:
   a first resistor having first and second nodes, said first resistor first node being coupled to the collector of said third transistor, and said first resistor second node being adapted to receive the amplifier input signal; and
   a second resistor being coupled between the input and the output of said second operational amplifier.

16. A method of producing an output signal which represents an input signal modified by temperature, the method comprising the steps of:
   generating a first order temperature dependent signal;
   generating a temperature reference signal;
   dividing a first one of the temperature dependent signal and the temperature reference signal by a second one of the temperature dependent signal and the temperature reference signal; and
   multiplying the quotient of said dividing step by the input signal.

17. A method as claimed in claim 16 wherein the quotient from said dividing step represents the temperature dependent signal divided by the temperature reference signal so that the output signal varies in direct proportion to temperature.

18. A method as claimed in claim 16 wherein the quotient from said dividing step represents the temperature reference signal divided by the temperature dependent signal so that the output signal varies inversely proportional to temperature.

19. A temperature dependent amplifier comprising:
a first order temperature dependent signal source;
a temperature reference signal source;
a first transistor having a base, a collector, and an emitter, said first transistor emitter being coupled to said temperature dependent signal source and said first transistor collector being coupled to said first transistor base;
a second transistor having a base, a collector, and an emitter, said second transistor base being coupled to said first transistor emitter;
a third transistor having a base, a collector, and an emitter, said third transistor emitter being coupled to the emitter of said second transistor;
a fourth transistor having a base, a collector, and an emitter, said fourth transistor emitter being coupled to the base of said third transistor, said fourth transistor base being coupled to the base of said first transistor, and said fourth transistor collector being coupled to said temperature reference signal source;
an operational amplifier having an input and an output, said operational amplifier output being coupled to the emitter of said second transistor; and
a resistor having a node coupled to the input of said operational amplifier, the node of said resistor being connected to one of the collector of said second transistor and the collector of said third transistor.

* * * * *